United States Patent
Levy et al.

(10) Patent No.: US 11,502,912 B2
(45) Date of Patent: Nov. 15, 2022

(54) CACHE MEMORY MANAGEMENT USING FINGERPRINTS

(71) Applicant: MELLANOX TECHNOLOGIES TLV LTD., Raanana (IL)

(72) Inventors: Gil Levy, Hod Hasharon (IL); Pedro Reviriego, Madrid (ES); Salvatore Pontarelli, Rome (IT)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 141 days.

(21) Appl. No.: 17/137,729

(22) Filed: Dec. 30, 2020

(65) Prior Publication Data

US 2022/0210022 A1  Jun. 30, 2022

(51) Int. Cl.
| | |
|---|---|
| *H04L 41/12* | (2022.01) |
| *H04L 41/14* | (2022.01) |
| *H04L 1/00* | (2006.01) |
| *H04L 69/22* | (2022.01) |
| *H03M 13/03* | (2006.01) |
| *H04L 49/00* | (2022.01) |
| *H04L 67/5682* | (2022.01) |

(52) U.S. Cl.
CPC ............ *H04L 41/12* (2013.01); *H03M 13/03* (2013.01); *H04L 1/0041* (2013.01); *H04L 1/0045* (2013.01); *H04L 41/14* (2013.01); *H04L 49/3009* (2013.01); *H04L 67/5682* (2022.05); *H04L 69/22* (2013.01)

(58) Field of Classification Search
None
See application file for complete search history.

(56) References Cited

U.S. PATENT DOCUMENTS

| | | | | |
|---|---|---|---|---|
| 2018/0287941 | A1* | 10/2018 | Louzoun | H04L 45/745 |
| 2019/0149516 | A1* | 5/2019 | Rajahalme | H04L 45/74 |
| | | | | 370/392 |
| 2020/0076928 | A1* | 3/2020 | Wang | H04L 63/0485 |
| 2020/0084141 | A1* | 3/2020 | Bengough | H04L 45/42 |

(Continued)

OTHER PUBLICATIONS

Chiueh at al., "Cache Memory Design for Network Processors", Proceedings of the 6th International Symposium on High-Performance Computer Architecture (HPCA-6), Toulouse, France, pp. 1-10, year 2000.

(Continued)

*Primary Examiner* — Rebecca E Song
(74) *Attorney, Agent, or Firm* — Kligler & Associates Patent Attorneys Ltd

(57) ABSTRACT

A network device includes at least one communication ingress port, ingress packet processing circuitry and a packet-action cache memory (PACM). The at least one communication ingress port is configured to receive packets including packet headers from a network. The ingress packet processing circuitry is configured to receive the packets and to process the packets in accordance with respective packet actions specified for the packets. The PACM is configured to store one or more of the packet actions in association with one or more respective fingerprints which are calculated over the packet headers of the corresponding packets, for use by the ingress packet processing circuitry. The fingerprints are smaller than the corresponding packet headers.

18 Claims, 4 Drawing Sheets

(56) References Cited

U.S. PATENT DOCUMENTS

2020/0314011 A1* 10/2020 Deval .............. H04L 45/74591

OTHER PUBLICATIONS

Cisco Systems Inc., "Network Caching", White Paper, pp. 1-12, year 2000.

Reviriego et al., "When Filtering is not Possible Caching Negatives with Fingerprints Comes to the Rescue", Conference Paper, CoNEXT'20, pp. 1-8, Barcelona, Spain, Dec. 1-4, 2020.

"Infinispan 8.1 User Guide", chapter 12.4.3, pp. 1-3, Jul. 5, 2016 downloaded from https://web.archive.org/web/20190718070503/https://infinispan.org/docs/8.1.x/user_guide/user_guide.html.

* cited by examiner

content trimmed for brevity …

CACHE MEMORY MANAGEMENT USING FINGERPRINTS

FIELD OF THE INVENTION

The present invention relates generally to packet communication networks, and particularly to methods and systems for packet classification using hash-based memories.

BACKGROUND OF THE INVENTION

Network devices such as switches, hubs, routers, network interface devices (NICs) and host channel adapters (HCAs) process ingress packets, for example, to determine destinations to which the packets should be forwarded or to determine a service class. Typically, to quickly determine the required packet processing, a cache memory is used.

In an article by Chiueh and Pradhan entitled "Cache Memory Design for Network Processors," Proceedings of the Sixth International Symposium on High-Performance Computer Architectures (HPCA-6), Toulouse, France, 2000, the authors focus on cache memory designs for network processors and demonstrate that the incorporation of hardware caches into network processors, when combined with efficient caching algorithms, can significantly improve the overall packet forwarding performance.

SUMMARY OF THE INVENTION

An embodiment of the present invention that is described herein provides a network device including at least one communication ingress port, ingress packet processing circuitry and a packet-action cache memory (PACM). The at least one communication ingress port is configured to receive packets including packet headers from a network. The ingress packet processing circuitry is configured to receive the packets and to process the packets in accordance with respective packet actions specified for the packets. The PACM is configured to store one or more of the packet actions in association with one or more respective fingerprints which are calculated over the packet headers of the corresponding packets, for use by the ingress packet processing circuitry. The fingerprints are smaller than the corresponding packet headers.

In some embodiments, the PACM includes a search memory configured to store the fingerprints and the packet actions, and memory-access circuitry configured to (i) search for a fingerprint of a packet in the search memory, (ii) responsively to finding the fingerprint in the search memory, send the corresponding packet action to the ingress packet processing circuitry, and (iii) responsively to not finding the fingerprint in the search memory, take an alternative action. In an embodiment, the alternative action includes receiving a packet action that corresponds to the packet header of the packet, and storing the packet action in the search memory in association with the fingerprint.

In some embodiments, a false-positive probability of two different packet headers having a same fingerprint is lower than a preset false-positive limit value. In an embodiment, the false-positive limit value does not exceed a false-positive packet reception probability of the network. In an embodiment, the packets further include a Cyclic Redundancy Check (CRC) code having a failure probability, and the false-positive limit value does not exceed the failure probability of the CRC code.

In some embodiments, the PACM is configured to calculate the fingerprints according to header-fingerprinting rules. In an example embodiment, the PACM is configured to flush the stored fingerprints and the packet headers, and to change the header fingerprinting rules responsively to flushing the fingerprints and the packet headers. In a disclosed embodiment, the PACM is configured to calculate the fingerprints over (i) one or more field values of the packet headers and (ii) an additional number, and to change the additional number upon flushing the stored fingerprints and packet headers.

In another embodiment, the PACM includes a stash memory that is configured to store at least a packet header and a respective action, whose corresponding fingerprint is known to be associated with an additional, different packet header. Upon receiving a new packet header and a new fingerprint, the PACM is configured to initially search for the new header in the stash memory.

There is additionally provided, in accordance with an embodiment of the present invention, a method including, in a network device, receiving from a network packets comprising packet headers, and processing the packets in accordance with respective packet actions specified for the packets. Using a packet-action cache memory (PACM) in the network device, one or more of the packet actions are stored in association with one or more respective fingerprints which are calculated over the packet headers of the corresponding packets, for use in processing the packets. The fingerprints are smaller than the corresponding packet headers.

The present invention will be more fully understood from the following detailed description of the embodiments thereof, taken together with the drawings in which:

DETAILED DESCRIPTION OF EMBODIMENTS

Overview

Figure 1:
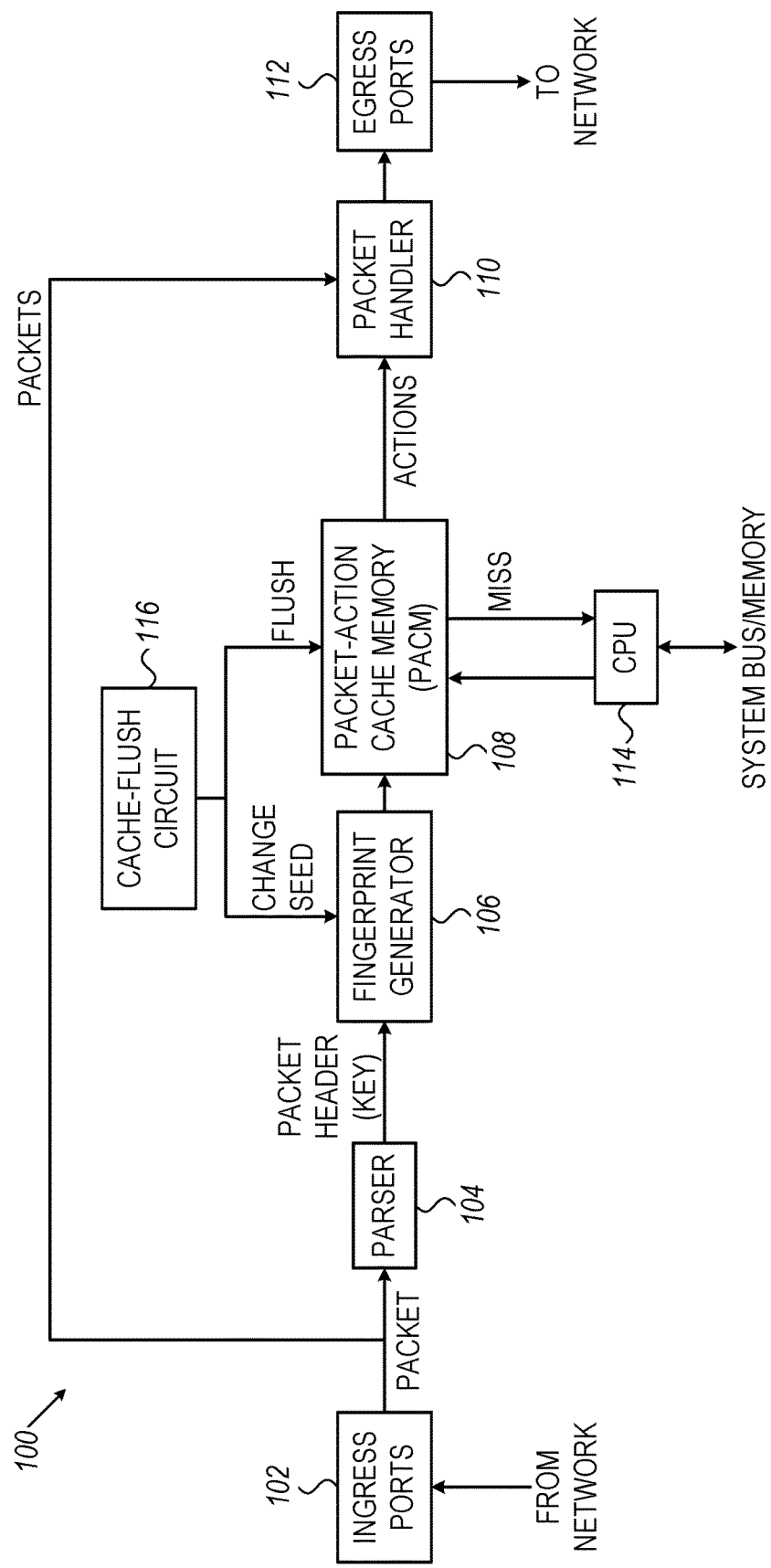
FIG. 1 is a block diagram that schematically describes a network device (ND), in accordance with an embodiment of the present invention.

Network devices (NDs), such as switches, routers, hubs, network interface cards (NICs) and host channel-adapters (HCAs) may receive large streams of high-bandwidth ingress packets in a plurality of flows. To rapidly classify the ingress packets, an ND may comprise a cache memory, which stores "actions" that the ND should take when processing the packets. Typically, the cache stores actions that are defined according to the headers of the packets. The ND may comprise a parser which is configured to extract packets from the headers, and to translate the headers to keys for more convenient processing. The cache is then accessed using the keys. We will refer below interchangeably to headers and to keys that are derived from the headers.

In practical implementation, the packet headers (and the corresponding keys) are typically large, requiring a large number of bits per cache entry. As a result, the cache memory either becomes large, expensive and power-consuming, or is able to cache only a small number of entries.

Embodiments of the present invention that are described herein provide improved methods and systems for caching of packet actions. In disclosed embodiments, the ND comprises a Packet-Action Cache Memory (PACM) that stores packet actions. As opposed to cache-access by packet headers, the disclosed PACM accesses the packet-actions using a smaller address-field that is derived from the headers (a "fingerprint" of the header). The PACM typically does not store the headers and does not compare the read data to the headers. Instead, determination of "cache hit" or "cache miss" is determined by comparison of fingerprints. This solution leads to substantial saving in the PACM area and power consumption. These savings, however, come at the cost of potential fingerprint ambiguity and the ensuing false-positive identification, since there is inevitably some finite probability that two different packet headers will translate into the same fingerprint.

In some embodiments, the fingerprint size is chosen such that the false-positive probability for a given ND, when the two packets arrive at close temporal proximity (during which the cache contents is not completely replaced) is extremely low and can be accepted. In an embodiment, 121-bit fingerprints are generated, and the false-positive probability is such that the Mean-Time-to-False-Packet-Acceptance (MTTFPA) is in the order of $10^{13}$ years—the universe time.

In some embodiments, the fingerprint size is smaller, and false positives may occasionally occur. To mitigate the cost of false positive identification and avoid blocking of an entire flow if its fingerprint falsely-matches the fingerprint of a previous header, the cache is periodically flushed, and a new mapping is used to generate further fingerprints. In some embodiments, to assure design robustness, the cache is periodically flushed even when the false-positive probability is extremely low, e.g., in the order of the universe time.

In an embodiment, the flushing of the cache is gradual, to avoid an abrupt performance degradation when all accesses to the cache miss.

Lastly, in some embodiments the PACM comprises a stash memory that stores a small number (typically one or two) of headers and corresponding actions. The ND periodically checks that a header-to-fingerprint translation is unique by comparing the translation to a list of headers and corresponding fingerprints that is stored in a main database. If an ambiguity is found, the PACM stores the header in the stash. The PACM searches for a match in the stash (comparing the full header) and, concurrently, in the fingerprint-accessed cache. If the header is found in the stash, the action to be taken is that stored in the stash.

System Description

Embodiments according to the present invention that are disclosed herein provide for reduced-size fingerprint accessing of a cache memory that defines packet actions in a Network Device (ND). In some embodiments, when a fingerprint is matched with an entry in the cache, the full header is not checked, and, thus, a false-positive header identification may occur; however, in embodiments, the probability for false positive is substantially below the probability that the ND will accept bad packets due to other reasons, and, hence, acceptable.

FIG. 1 is a block diagram that schematically describes a network device (ND) 100, in accordance with an embodiment of the present invention. ND 100 comprises Ingress Ports 102, which are configured to receive packets from a communication network (e.g., Ethernet, or InfiniBand™) and a Parser 104, which is configured to extract the packet headers (in some embodiments, Parser 104 also encodes the header and outputs a key that corresponds to the header; we will refer hereinbelow to keys and packet-headers interchangeably).

ND 100 further comprises a Fingerprint Generator 106, which is configured to calculate a fingerprint of the keys; a Packet-Action-Cache-Memory (PACM) 108, which is configured to store actions that correspond to fingerprints of keys; a Packet Handler 110, which is configured to receive the packets and the corresponding actions and to manipulate the packets according to the actions; and, Egress Ports 112, which are configured to send the manipulated packets over the communication network.

In various embodiments, fingerprint generator 106 may use any suitable function or technique for calculating fingerprints from packet headers. Several non-limiting examples of such functions include hash functions such as Murmur3 and Cityhash, as well as CRC.

In some embodiments, PACM 108 comprises a search memory and memory-access circuitry (not seen in the figure). For the sake of clarity, actions performed by the memory-access circuitry are referred to herein as performed by the PACM as a whole; and similarly, information stored in the search memory are referred to as stored in the PACM as a whole.

If PACM 108 does not store a fingerprint that the PACM receives (from Fingerprint Generator 106), the PACM signals a cache-miss to a CPU 114. The CPU will then find a required action by other means (e.g., accessing a large external memory and/or running algorithms to determine a suitable action). CPU 108 may then add an entry in PACM 108, specifying a corresponding action for the fingerprint (typically, if the cache is full, the new entry replaces an older entry in the PACM). In some embodiments, the PACM signals cache misses to dedicated cache-miss handling circuitry (not shown), in addition or instead of signaling the cache miss to the CPU.

In embodiments, Fingerprint Generator 106 generates fingerprints that are significantly smaller than the corresponding headers and, hence, the footprint of PACM 108 may be smaller than that of a cache which is accessed by the full header. This approach may lead to fingerprint ambiguity (that is—the same fingerprint is generated for more than one header) and, consequently, to false identification of an input header as a different input header that is stored in the cache (such false identifications are referred to as "false positives"). In embodiments, the probability for a false positive is small enough to be allowed (e.g., expected once in a universe time). In other embodiments, to further reduce the PACM footprint, some amount of false-positive fingerprint matching is allowed, for example, with an expectancy of once every 100 years.

In this latter case, however, if two keys have the same fingerprint, a packet flow may be completely blocked. Suppose, for example, that the ND receives two packet flows having the same fingerprint. If a fingerprint of the first flow is stored in the PACM, all packets of the second flow will be falsely identified as packets of the first flow, and the ND will fail to process packets of the second flow. To mitigate this incidence, in some embodiments, a Cache-Flush-Circuit 116 periodically flushes PACM 108 and instructs Fingerprint Generator 106 to generate further fingerprints using a new seed.

Thus, according to the example embodiment illustrated in FIG. 1, the required actions to be taken on ingress packets are determined using a reduced footprint cache memory, at a negligible cost in false-positive identification, which is further mitigated by periodical cache-flushing.

As would be appreciated, the configuration of ND 100 illustrated in FIG. 1 and described above is an example configuration that is depicted purely for the sake of conceptual clarity. Other suitable configurations may be used in alternative embodiments of the present invention. For example, in some embodiments, the manipulated packets are output to a CPU (e.g., CPU 114, or a host CPU that is coupled to the ND through a system bus (not shown)). In some embodiments, when the CPU finds a suitable action following a cache miss, the CPU sends the action to Packet Handler 110 (in addition to storing the action in the PACM). In embodiments, the CPU does not necessarily add a corresponding entry in the PACM in the case of a miss—for example, in some embodiments the CPU may refrain from replacing frequently accessed fingerprints when a new, possibly rare, fingerprint is missed.

Implications of False Positive Header Identification

For some applications (e.g., telemetry) a false positive may be allowed; for other applications such as forwarding decisions, false positive should be avoided.

However, in communication systems a small false-positive probability greater than zero is usually allowed. For example, when a packet is protected against noise by a 32-bit CRC, the probability that multiple erroneous bits will result in the correct CRC (and, hence, the packet will be accepted as good) is small but non-zero. An acceptable MTTFA (Mean Time to False Packet Acceptance) should usually be larger than the universe time (~13e9 years, or ~4e17 seconds). This number is exceeded with 32-bit CRC, assuming 100 Gbps and bit-error-rate (BER) of $10^{-15}$.

When using fingerprints to access an action cache the fingerprint size may be selected so that the MTTFA will be larger than the universe time. The probability of a false-positive identification of a fingerprint is approximately N*Cache size/$2^{fp}$, where N is the number of different flows and fp is the number of fingerprint bits. Assuming that at a given time T the number of different flows crossing the switch is 1,000,000, and that the cache size is 1000 entries, we get, for fingerprint size=128 bit:

1000000*1000/$2^{128}$=2.8e-30. Assuming 100M packet per second, MTTFA will be around 3e21 seconds, or larger than the universe time. In fact, a 111 bit fingerprint will achieve the required MTTFA.

Figure 2:
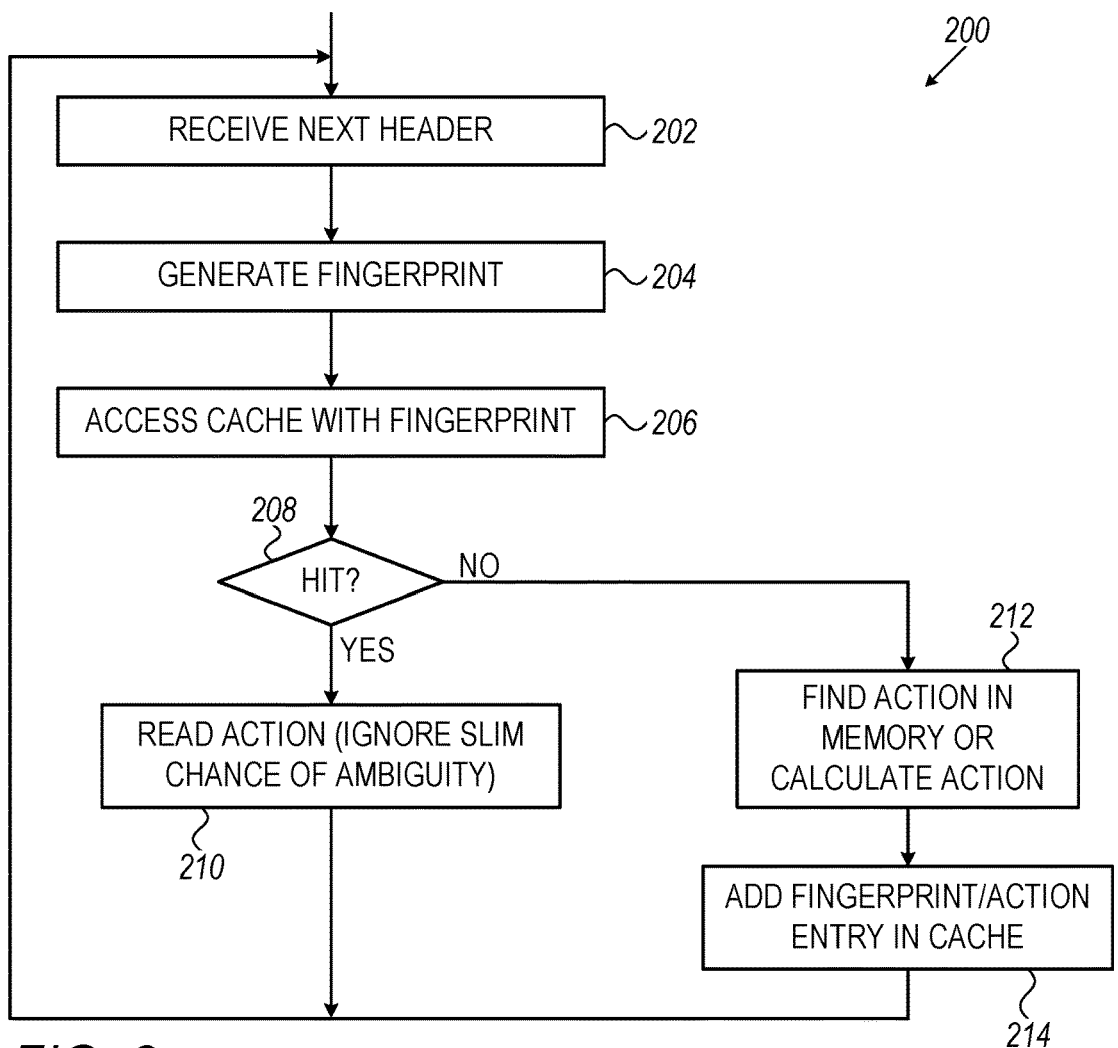
FIG. 2 is a flowchart that schematically illustrates a method for determining packet actions using a fingerprint accessed Packet-Action Cache Memory (PACM), in accordance with an embodiment of the present invention.

FIG. 2 is a flowchart 200 that schematically illustrates a method for determining packet actions using a fingerprint accessed PACM, in accordance with an embodiment of the present invention. The flow is executed by ND 100. The flow starts at a Receive-Header step 202, wherein Fingerprint Generator 106 (FIG. 1) receives a header (e.g., from Parser 104, FIG. 1). Next, in a Generate Fingerprint step 204, Fingerprint Generator 106 generates a fingerprint of the header. Typically, the fingerprint generator uses random numbers to generate fingerprints from the headers. By changing the random number seed, different fingerprints will be generated for the same header.

Next, in an Access Cache step 206, the ND accesses PACM 108 (FIG. 1) using the fingerprint as an index, and then proceeds to a Check-Hit step 208. If the fingerprint is stored in the cache a "hit" is detected; as the probability of false-positive hit is small enough to be ignored, the ND proceeds to a Read-Action step 210 and reads the required packet action. The ND then reenters step 202, to receive the next header.

If, in step 208, the fingerprint is not stored in the cache (a "miss"), the ND (typically using CPU 114, or using dedicated circuitry) enters a Use-Find-Action step 212, and selects a suitable action according to the header by other means (e.g., by searching for an action in a large external memory, or running a suitable algorithm). The ND then enters an Adding-Cache-Entry step 214, and adds an entry comprising the fingerprint and the action to the PACM. The ND then reenters step 202, to receive the next header.

As would be appreciated, flowchart 200 illustrated in FIG. 2 and described above is an example embodiment that is cited by way of example. Other flowcharts may be used in alternative embodiments. For example, in some embodiments, to reduce the time to find an action in case of a cache-miss, CPU 114 may execute step 212 (search for an action) when the header is received (after step 202), in parallel to steps 204, 206, 208. In case of a "hit" step 212 will be aborted, but in the case of a "miss" step 212 will continue rather than start.

Flushing the PACM

As described above, in some embodiments (e.g., when the fingerprint size allows a small amount of false-positive), the PACM is occasionally flushed and a new fingerprinting seed is defined, to mitigate the risk that a flow will be completely blocked. In other embodiments, for better design robustness, the PACM is occasionally flushed regardless of the false-positive probability.

In some embodiments, the PACM is gradually flushed—when a new seed is defined, the cache gradually fills with new fingerprints. However, in this case the PACM will be searched for new and old fingerprints at the same time, which may decrease the performance.

In other embodiments, some of the header bits (or a hash function calculated on some or all the header bits) are compared to a threshold value that starts (when the flush is initiated) at zero, and gradually increments. The fingerprint generator calculates fingerprints using the new seed if the binary value represented by the selected header bits is larger than the threshold and using the old seed otherwise. At the end of the transition period the threshold value reaches a maximum value, and flushing is completed.

Figure 3:
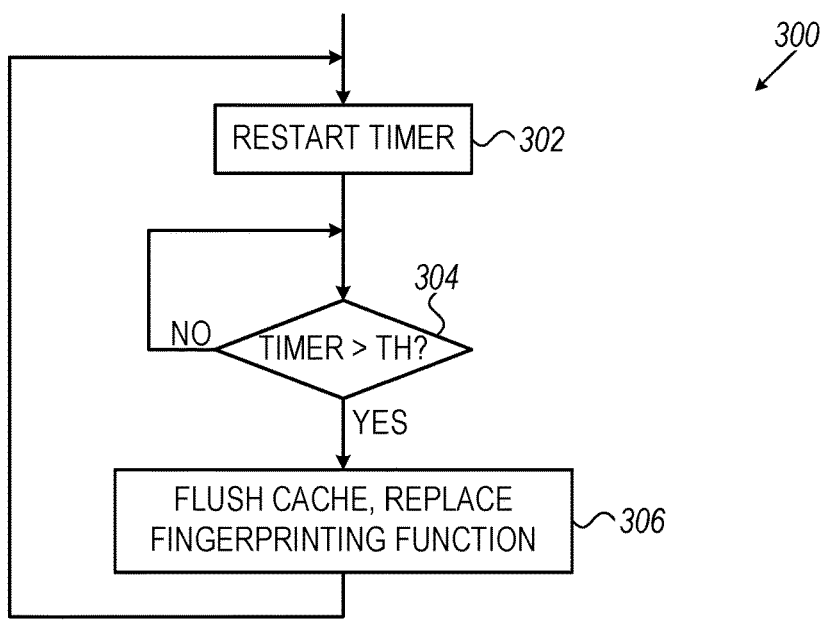
FIG. 3 is a flowchart that schematically illustrates a first method for flushing a PACM, in accordance with an embodiment of the present invention.

FIG. 3 is a flowchart that schematically illustrates a method for flushing a PACM, in accordance with an embodiment of the present invention. The flow is executed by Cache-Flush Circuit 116 (FIG. 1). The flow starts at a Restart Timer step 302, wherein the Cache-Flush Circuit clears a timer. Next, at a Check-Timer step 304, the Cache-Flush Circuit checks if the timer has exceeded a preset threshold; if the threshold is not reached yet, the Cache-Flush Circuit loops over step 304 until the threshold is reached. When the threshold is reached, the Cache-Flush Circuit enters a Flush-Cache step 306, wherein the Cache-Flush Circuit flushes the PACM and changes the seed function for generating further fingerprints. As will be described below, the flushing of the PACM, as well as the using of a new seed for fingerprint generation, may be gradual. After step 306 the Cache-Flush Circuit reenters step 302, to restart the timer.

As would be appreciated, flowchart 300 illustrated in FIG. 3 is an example method that is depicted by way of example. Other flowcharts may be used in alternative embodiments. For example, in some embodiments the criterion to flush the PACM may be the number of cache hits. In another embodiment, the criterion may be cache accesses. In some embodiments the threshold may vary according to the nature of the communication. In an embodiment, the PACM is never flushed.

Gradual PACM Flush

Figure 4:
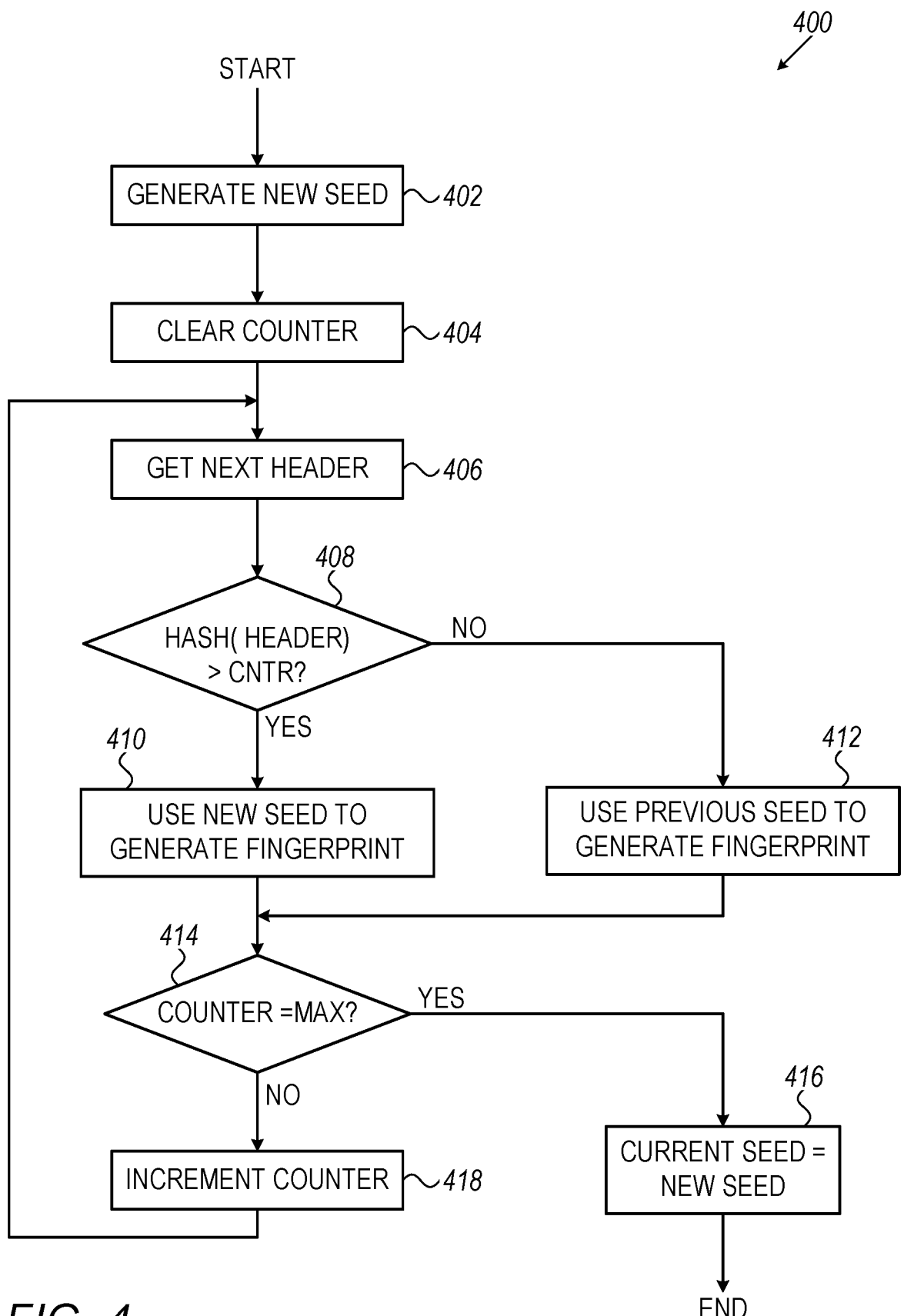
FIG. 4 is a flowchart that schematically describes a method to gradually replace a fingerprint generation seed, in accordance with an embodiment of the present invention.

Invalidating of all cache entries at the same time may lead to a performance drop as all accesses to the cache will be "missed" until the cache refills. To mitigate, in some embodiments the PACM is flushed gradually. FIG. 4 is a flowchart that schematically describes a method 400 to gradually replace a fingerprint generation seed, in accordance with an embodiment of the present invention. The flowchart is executed by Fingerprint Generator 106 (FIG. 1). The flowchart starts at a Generate-New-Seed step 402, wherein the Fingerprint Generator generates a new seed to be gradually used in the generation of further fingerprints. Next, the Fingerprint Generator enters a Clear Counter step 404, and clears a counter (comprising, for example, 20 bits). The Fingerprint Generator then gets the next header (in a Get-Next-Header step 406) and enters a Compare-Header-Hash step 408. In step 408 the Fingerprint Generator checks if a random number that is generated by a predefined hash function of the header is greater than the value of the counter. For example, if the counter is 20-bit, the random number should be between 0 and $2^{20}-1$. In some embodiments, the hash function may be the value of a subset of the header bits.

Responsively to the results of step 408 comparison, the Fingerprint Generator will enter a Use-New-Seed step 410 if the random number is greater than the counter, or a Use-Previous-Seed 412 if it is not, and use the new seed or the previous seed (respectively) to generate a fingerprint for the current header.

After step 410 or 412, the Fingerprint Generator enters a Check-Counter-Max step 414 and checks if the counter has reached a predefined maximum value (e.g., $2^{20}-1$). If so, the gradual cache-flush is complete, and the Fingerprint Generator, in a Set-Current-Seed step 416, will set the new seed as the current seed for further fingerprinting generation ("forgetting" the previous seed), and exit the flowchart. If, in step 414, the counter has not reached the maximum value, the Fingerprint Generator will, in an Increment-Counter step 418, increment the counter and then reenter step 406, to fingerprint the next key.

Thus, according to the example embodiment illustrated in FIG. 4, fingerprints generated with the new seed gradually replace fingerprints generated with the previous seed, and the PACM is gradually flushed.

As would be appreciated, flowchart 400 illustrated in FIG. 4 is an example gradual-cache-flush method that is depicted by way of example. Other flowcharts may be used in alternative embodiments. For example, in some embodiments, the frequency in which the new seed is used for fingerprint generation gradually increases. In other embodiments, the odds to use the new seed gradually increase irrespectively of the key value. In some embodiments, the counter will not increment (in step 418) unless a predefined time interval since the last counter increment has elapsed; In other embodiments, a pre-scaler may be used, and the counter may be incremented after a predefined number of packets (e.g., 200,000) has been received. In yet other embodiments, the counter is replaced by a timer, which increments at predefined time intervals.

Hybrid Cache

In some embodiments, the PACM comprises, in addition to the fingerprint-accessed cache ("search memory"), a small Stash memory that stores the full key and the respective action for a small number of packets (typically one or two). The stash memory is accessed in parallel to the cache and used to resolve fingerprint ambiguities. In embodiments, the ND further comprises a full action memory, which stores the keys and the corresponding fingerprints, and is used to detect fingerprint ambiguities.

Figure 5:
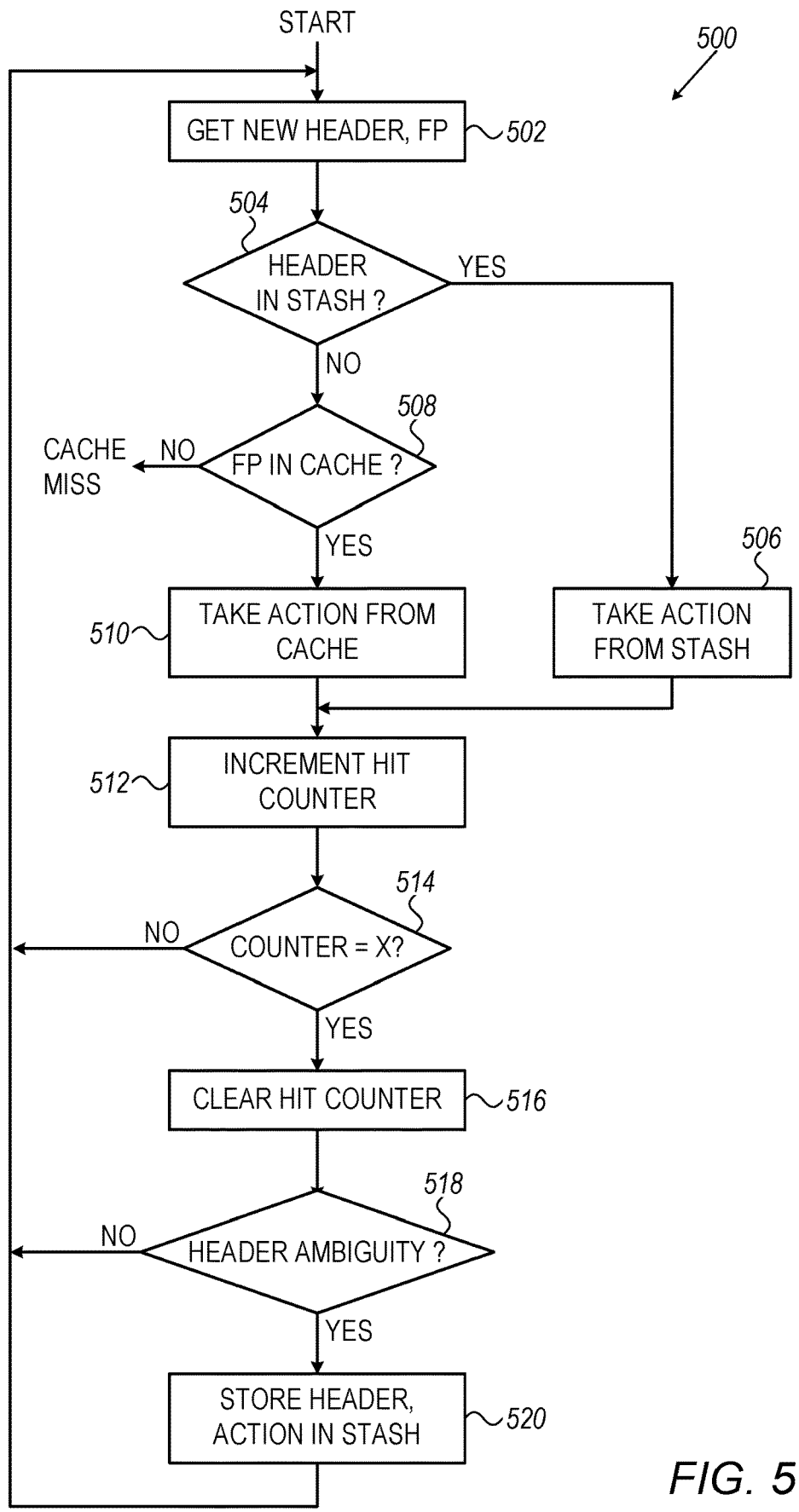
FIG. 5 is a flowchart that schematically describes a method to manage a hybrid cache, in accordance with an embodiment of the present invention.

FIG. 5 is a flowchart that schematically describes a method 500 to manage a hybrid cache, in accordance with an embodiment of the present invention. The flowchart is executed by an ND 100 (FIG. 1), in which the PACM comprises a single-entry stash (not shown). The flow starts at a Get-New-Header step 502, wherein Parser 104 and Fingerprint-Generator 106 (FIG. 1) output a header and a corresponding fingerprint. Next, in a Check-Header-in-Stash step 504, the PACM compares the header to the header that is stored in the stash. If the header matches, the PACM, in a Take-Action-From-Stash step 506, will signal Packet-Handler 110 (FIG. 1) to take the action specified in the stash. If the header is not in the stash, the PACM will enter a Check-Fingerprint-In-Cache step 508, and check if the fingerprint is in the cache. If so, the PACM will, in a Take-Action-From-Cache step 510, signal Packet-Handler 100 to take the action specified in the cache. If, in step 508, the fingerprint is not found the in the cache, the ND will enter a cache-miss procedure (e.g., steps 212, 214 in flowchart 200, FIG. 2).

After either step 506 or step 510, the ND, in an Increment-Hit-Counter step 512, increments a hit-counter that counts cache hits and then, in a Check-Hit-Counter step 514, checks if the counter has reached a predefined value X. If the counter has not reached X, the ND reenters step 502, to handle the next header/fingerprint pair.

If, in step 514, the counter has reached the preset value (X), the ND takes an ambiguity mitigation action: clears the hit-counter in a Clear-Hit-Counter step 516, and then, in a Check-Header-Ambiguity step 518, checks if the current header has an ambiguous fingerprint (typically by consulting a full action-memory, comprising full headers and corresponding fingerprints; unlike PACM 108, this memory is large and cannot be accessed in one cycle). If there is no ambiguity, the ND reenters step 502 to handle the next header/fingerprint pair. If, in step 518, fingerprint ambiguity is found, the ND enters a Store-in-Stash step 520 and stores the header/fingerprint pair in the stash, replacing the previous pair. The ND then reenters step 502.

As would be appreciated, flowchart 500 illustrated in FIG. 5 is an example hybrid-cache method that is depicted by way of example. Other flowcharts may be used in alternative embodiments. For example, in some embodiments, the stash comprises more than one entry, and new entries replace the oldest or the least recently used entries. In some embodiments, the full action-memory, which takes several cycles to access, is accessed whenever the parser outputs a header, saving time if the flowchart reaches step 518 (otherwise the access is aborted and restarted with each new header). In some embodiments, the decision to check for ambiguity is determined by other or by additional means (e.g., triggered by error notifications from peer network devices).

The configurations of ND 100, including fingerprint generator 106, PACM 108 and Cache-Flush-Circuit 116; flowcharts 200, 300, 400 and 500 are example configurations and flowcharts that are shown purely for the sake of conceptual clarity. Any other suitable configurations and flowcharts can be used in alternative embodiments. ND 100 may comprise, for example, a network-interface device, a communication switch, a router, a hub, a server with switching capabilities or aggregation of network elements. The different sub-units of ND 100 may be implemented using suitable hardware, such as in one or more Application-Specific Integrated Circuits (ASICs) or Field-Programmable Gate Arrays (FPGAs), using software, using hardware, or using a combination of hardware and software elements. The memory or memories in PACM 108, e.g., search memory and stash memory, may be implemented using any suitable memory type, e.g., Random Access Memory (RAM).

CPU 114 (FIG. 1) may comprise a general-purpose processor, which is programmed in software to carry out the functions described herein. The software may be downloaded to the processor in electronic form, over a network or from a host, for example, or it may, alternatively or additionally, be provided and/or stored on non-transitory tangible media, such as magnetic, optical, or electronic memory.

Although the embodiments described herein mainly address packet classification systems, the methods and systems described herein can also be used in other applications, such as in cache memories in computer systems. It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A network device, comprising:
at least one communication ingress port, to receive packets comprising packet headers from a network;
ingress packet processing circuitry, to receive the packets and to process the packets in accordance with respective packet actions specified for the packets; and
a packet-action cache memory (PACM), to store one or more of the packet actions in association with one or more respective fingerprints which are calculated over the packet headers of the corresponding packets, for use by the ingress packet processing circuitry, wherein the fingerprints are smaller than the corresponding packet headers, and wherein a false-positive probability of two different packet headers having a same fingerprint is lower than a preset false-positive limit value that does not exceed a false-positive packet reception probability of the network.

2. The network device according to claim 1, wherein the PACM comprises:
a search memory, to store the fingerprints and the packet actions; and
memory-access circuitry, to:
search for a fingerprint of a packet in the search memory;
responsively to finding the fingerprint in the search memory, send the corresponding packet action to the ingress packet processing circuitry; and
responsively to not finding the fingerprint in the search memory, take an alternative action.

3. The network device according to claim 2, wherein the alternative action comprises receiving a packet action that corresponds to the packet header of the packet, and storing the packet action in the search memory in association with the fingerprint.

4. The network device according to claim 1, wherein the packets further comprise a Cyclic Redundancy Check (CRC) code having a failure probability, and wherein the false-positive limit value does not exceed the failure probability of the CRC code.

5. The network device according to claim 1, wherein the PACM is to calculate the fingerprints according to header-fingerprinting rules.

6. The network device according to claim 5, wherein the PACM is to flush the stored fingerprints and the packet headers, and to change the header fingerprinting rules responsively to flushing the fingerprints and the packet headers.

7. The network device according to claim 5, wherein the PACM is to calculate the fingerprints over (i) one or more field values of the packet headers and (ii) an additional number, and to change the additional number upon flushing the stored fingerprints and packet headers.

8. The network device according to claim 1, wherein the PACM comprises a stash memory that is to store at least a packet header and a respective action, whose corresponding fingerprint is known to be associated with an additional, different packet header, and wherein, upon receiving a new packet header and a new fingerprint, the PACM is to initially search for the new header in the stash memory.

9. A method, comprising:
in a network device, receiving, from a network, packets comprising packet headers, and processing the packets in accordance with respective packet actions specified for the packets; and
using a packet-action cache memory (PACM) in the network device, storing one or more of the packet actions in association with one or more respective fingerprints which are calculated over the packet headers of the corresponding packets, for use in processing the packets, wherein the fingerprints are smaller than the corresponding packet headers, and wherein a false-positive probability of two different packet headers having a same fingerprint is lower than a preset false-positive limit value that does not exceed a false-positive packet reception probability of the network.

10. The method according to claim 9, wherein storing the packet actions and the fingerprints comprises:
storing the packet actions and the fingerprints in a search memory;
searching for a fingerprint of a packet in the search memory;
responsively to finding the fingerprint in the search memory, sending the corresponding packet action to the ingress packet processing circuitry; and
responsively to not finding the fingerprint in the search memory, taking an alternative action.

11. The method according to claim 10, wherein taking the alternative action comprises receiving a packet action that corresponds to the packet header of the packet, and storing the packet action in the search memory in association with the fingerprint.

12. The method according to claim 10, wherein the packets further comprise a Cyclic Redundancy Check (CRC) code having a failure probability, and wherein the false-positive limit value does not exceed the failure probability of the CRC code.

13. The method according to claim 9, and comprising calculating the fingerprints according to header-fingerprinting rules.

14. The method according to claim 13, and comprising flushing the stored fingerprints and the packet headers, and changing the header fingerprinting rules responsively to flushing the fingerprints and the packet headers.

15. The method according to claim 13, wherein calculating the fingerprints comprises calculating the fingerprints over (i) one or more field values of the packet headers and (ii) an additional number, and changing the additional number upon flushing the stored fingerprints and packet headers.

16. The method according to claim 9, and comprising, upon receiving a new packet header and a new fingerprint, initially searching for the new header in a stash memory, which is to store at least a packet header and a respective action whose corresponding fingerprint is known to be associated with an additional, different packet header.

17. A network device, comprising:
   at least one communication ingress port, to receive packets comprising packet headers from a network;
   ingress packet processing circuitry, to receive the packets and to process the packets in accordance with respective packet actions specified for the packets; and
   a packet-action cache memory (PACM), to store one or more of the packet actions in association with one or more respective fingerprints which are calculated over the packet headers of the corresponding packets, for use by the ingress packet processing circuitry, wherein the fingerprints are smaller than the corresponding packet headers, wherein the PACM is to calculate the fingerprints according to header-fingerprinting rules over (i) one or more field values of the packet headers and (ii) an additional number, and to change the additional number upon flushing the stored fingerprints and packet headers.

18. A method, comprising:
   in a network device, receiving, from a network, packets comprising packet headers, and processing the packets in accordance with respective packet actions specified for the packets; and
   using a packet-action cache memory (PACM) in the network device, storing one or more of the packet actions in association with one or more respective fingerprints which are calculated over the packet headers of the corresponding packets, for use in processing the packets, wherein the fingerprints are smaller than the corresponding packet headers,
   and comprising calculating the fingerprints according to header-fingerprinting rules over (i) one or more field values of the packet headers and (ii) an additional number, and changing the additional number upon flushing the stored fingerprints and packet headers.

* * * * *